(12) United States Patent
Hamada et al.

(10) Patent No.: US 6,204,707 B1
(45) Date of Patent: Mar. 20, 2001

(54) FLIP-FLOP CIRCUIT WITH CLOCK SIGNAL CONTROL FUNCTION AND CLOCK CONTROL CIRCUIT

(75) Inventors: Mototsugu Hamada, Yokohama; Tadahiro Kuroda, Sumida-ku, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/383,880

(22) Filed: Aug. 26, 1999

(30) Foreign Application Priority Data

Aug. 26, 1998 (JP) .................................................. 10-240713

(51) Int. Cl.⁷ ............................. H03K 3/037; H03K 5/13
(52) U.S. Cl. ......................... 327/202; 327/211; 327/212; 327/291
(58) Field of Search ..................................... 327/199, 200, 327/201, 202, 203, 208–212, 218, 291, 293, 294, 173, 176

(56) References Cited

U.S. PATENT DOCUMENTS 5,703,513 * 12/1997 Hashizume et al. .................. 327/202
5,999,030 * 12/1999 Inoue .................................... 327/202

FOREIGN PATENT DOCUMENTS 04298115A 10/1992 (JP) .............................. H03K/3/037
8106786 4/1996 (JP) .............................. G11C/11/409

OTHER PUBLICATIONS

Nogawa, et al., "A Data–Transition Look–Ahead DFF Circuit for Statistical reduction in Power Consumption," 1997 Symposium on VLSI Circuits Digest of Technical Papers, pp. 101–102.

* cited by examiner

Primary Examiner—Tuan T. Lam
(74) Attorney, Agent, or Firm—Hogan & Hartson, LLP.

(57) ABSTRACT

A flip-flop circuit 10 is provided with a discord detecting circuit DDC and a clock control circuit CCC. The discord detecting circuit DDC detects the discord of a data input signal DIS of the flip-flop circuit 10 with a data output signal DOS thereof. When the data input signal DIS discords with the data output signal DOS, the clock control circuit CCC supplies a short pulse to the flip-flop circuit 10 as an internal clock signal ICLK in synchronism with the rising of an external clock signal ECLK. On the other hand, when the data input signal DIS coincides with the data output signal DOS, the clock control circuit CCC supplies a low level signal to the flip-flop circuit 10 as the internal clock signal ICLK. Thus, it is possible to suppress electric power consumption required to supply a clock signal, and to prevent errors from being caused in a flip-flop operation.

19 Claims, 14 Drawing Sheets

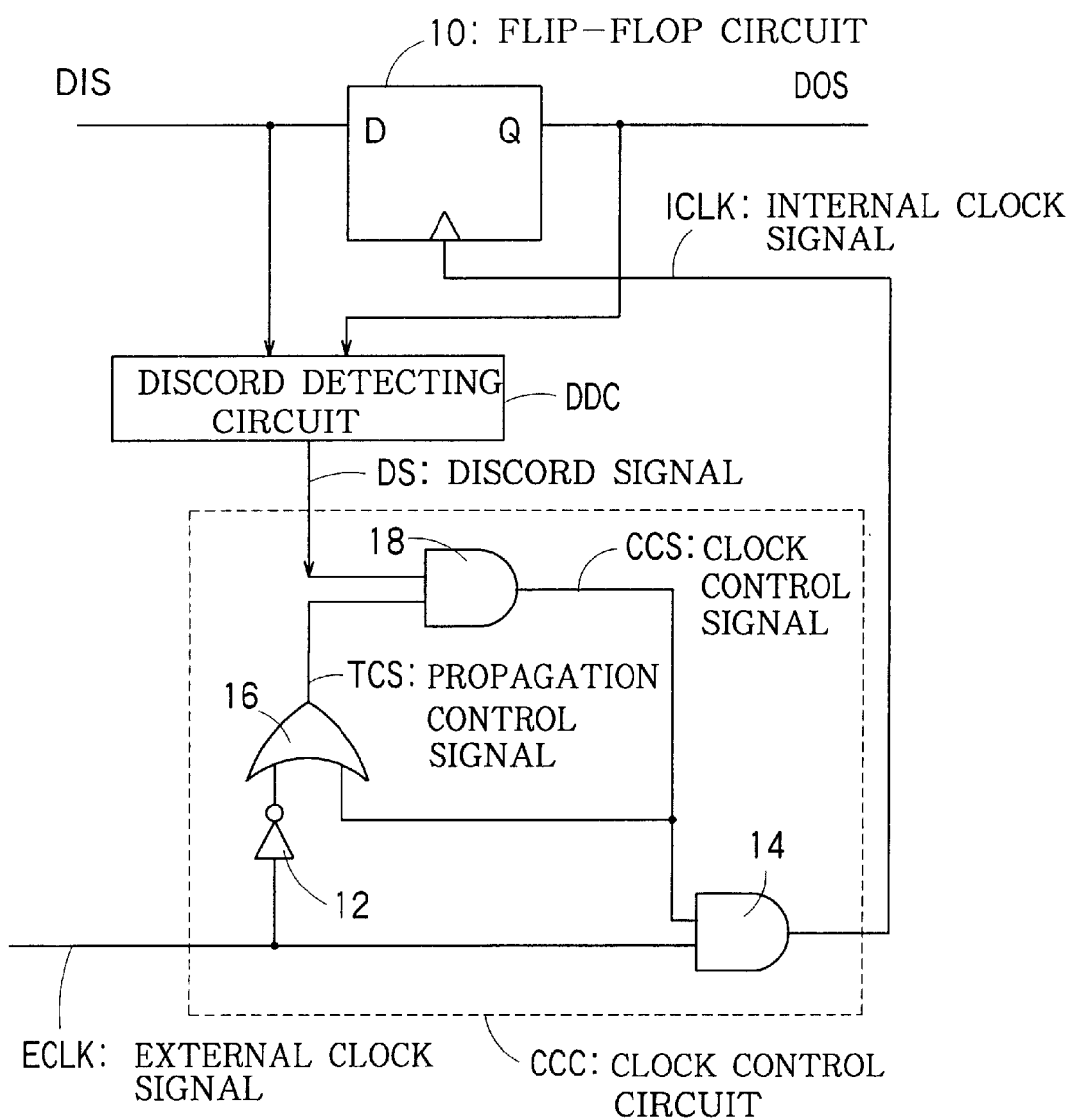
F I G. 1

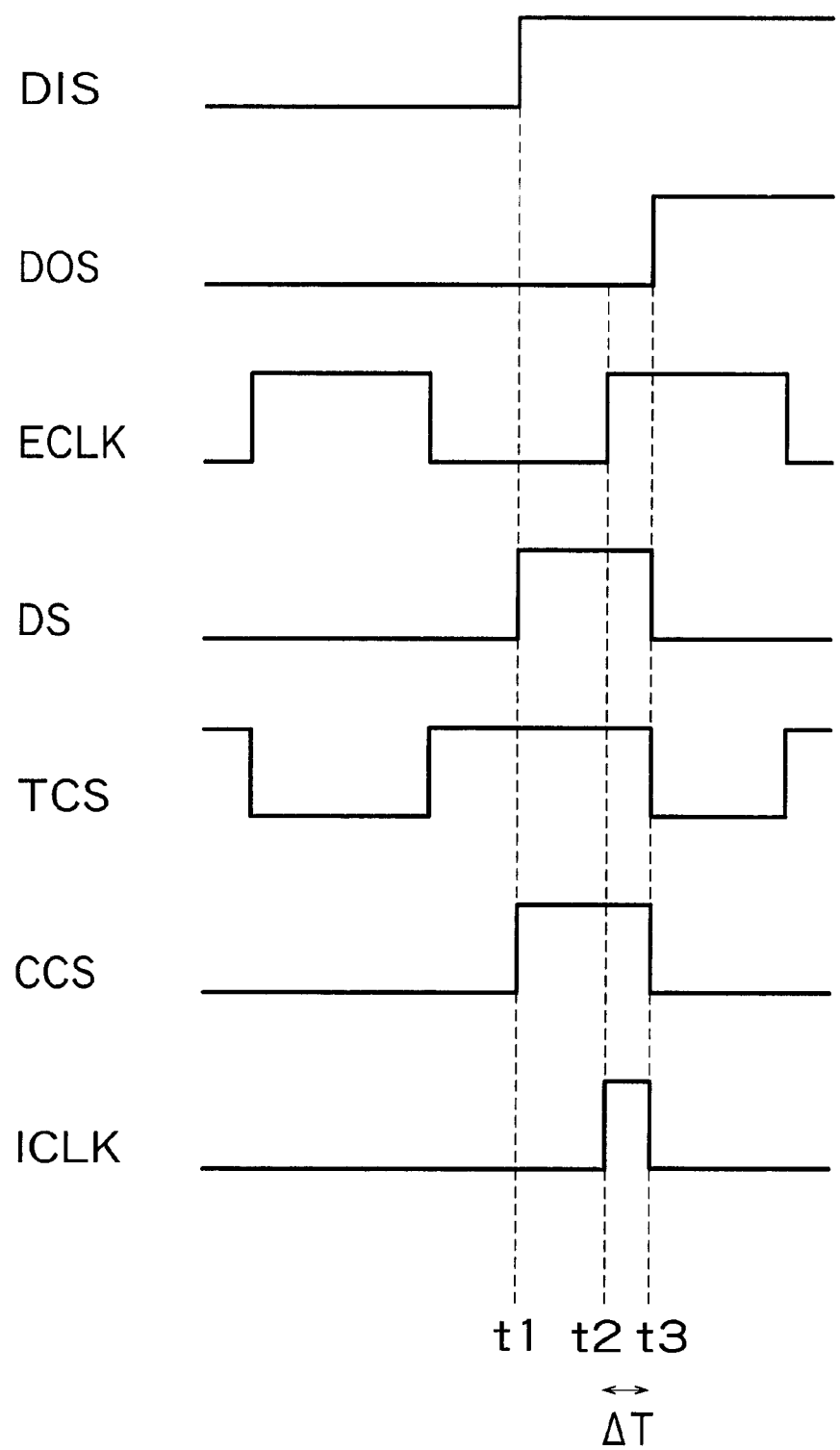
F I G. 2

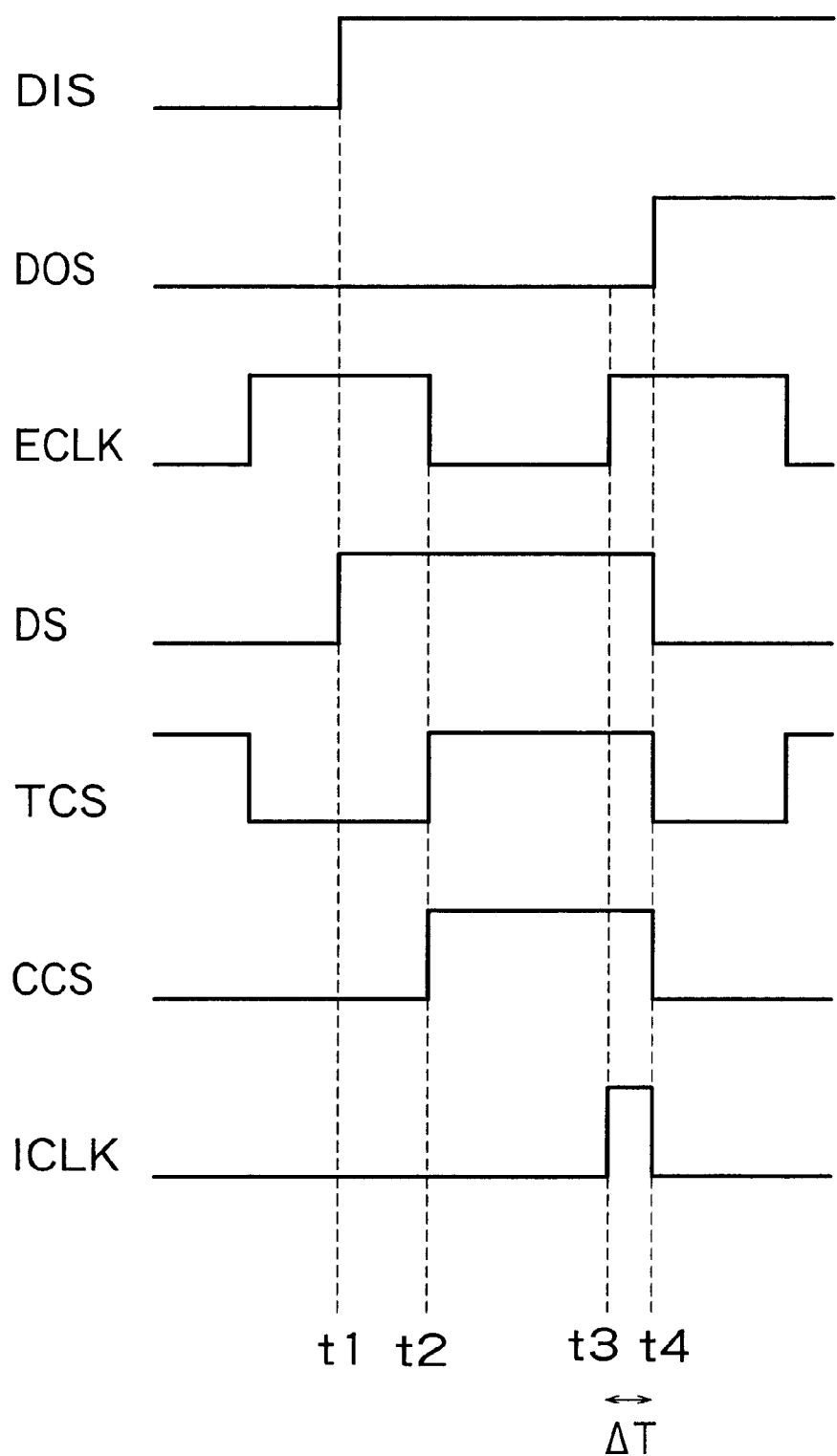
F I G. 3

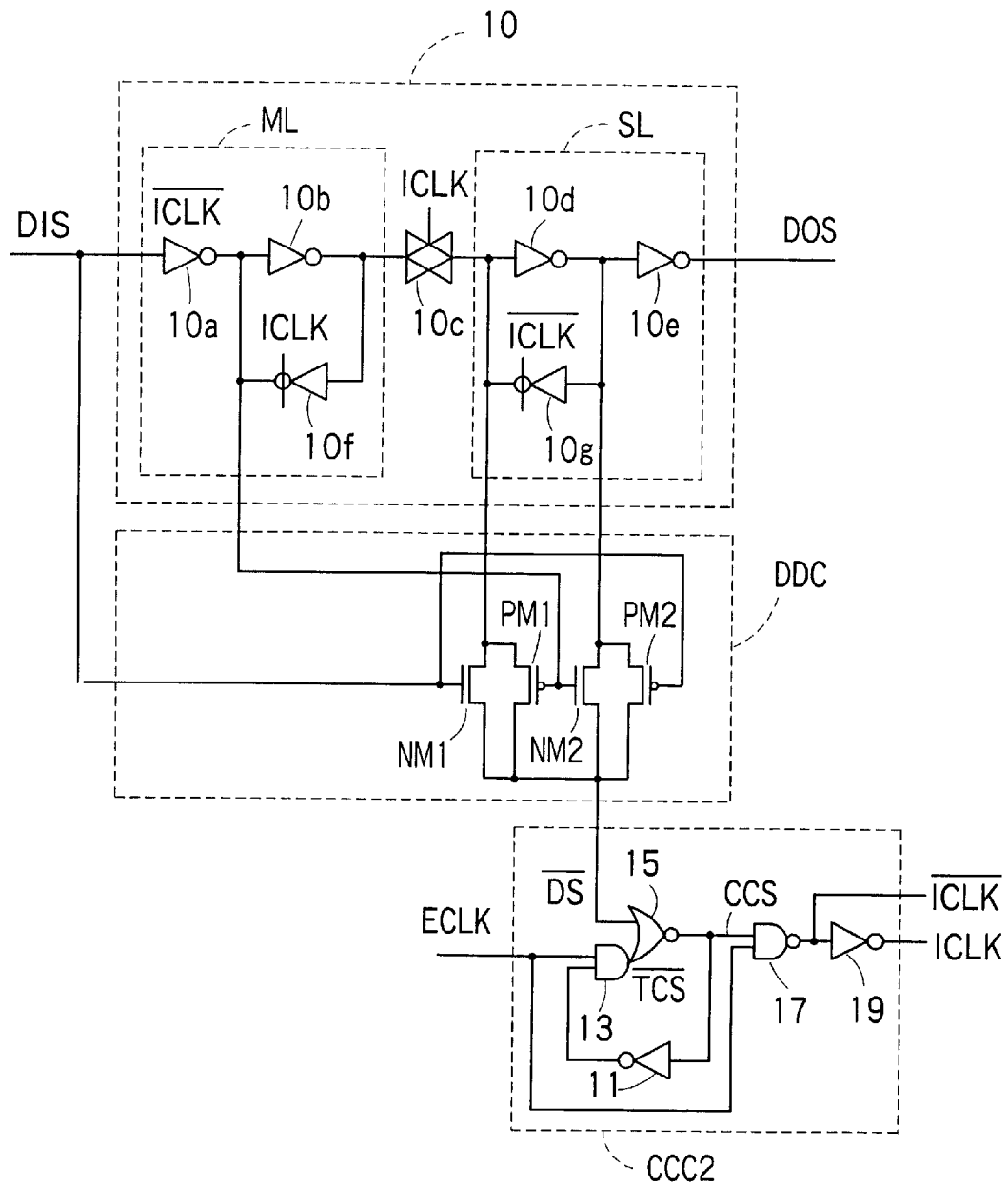
F I G. 4

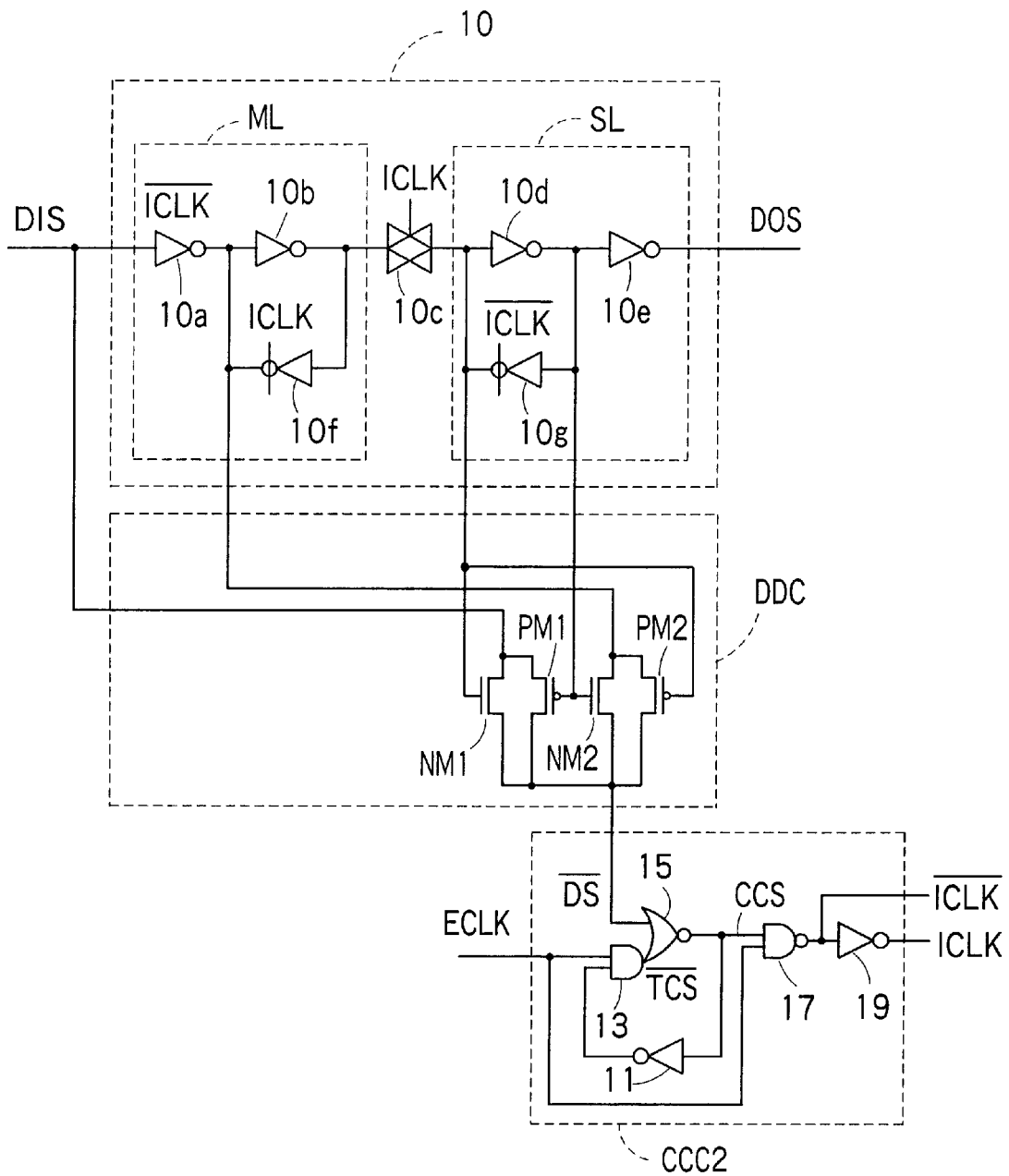
F I G. 4A

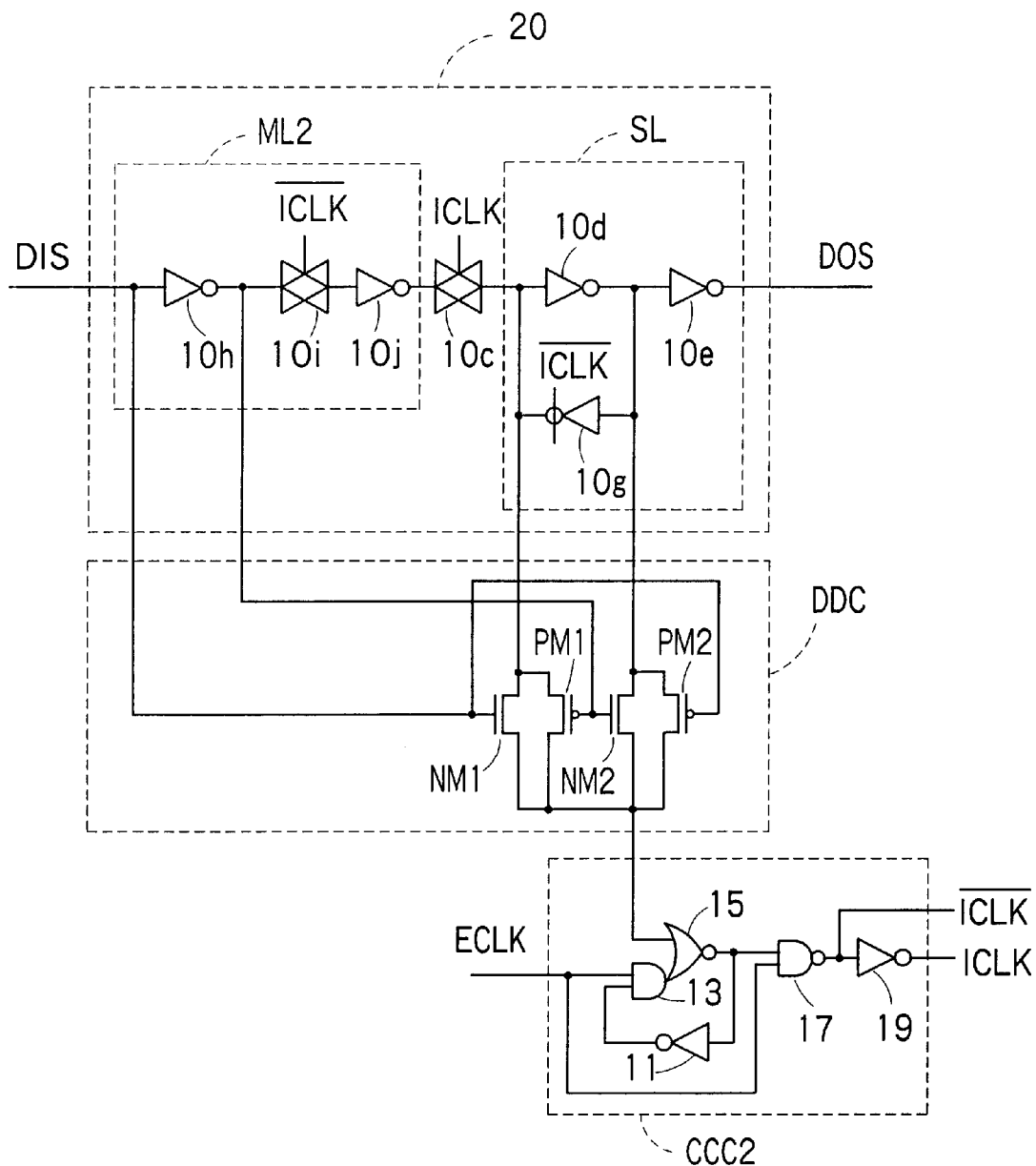
F I G. 5

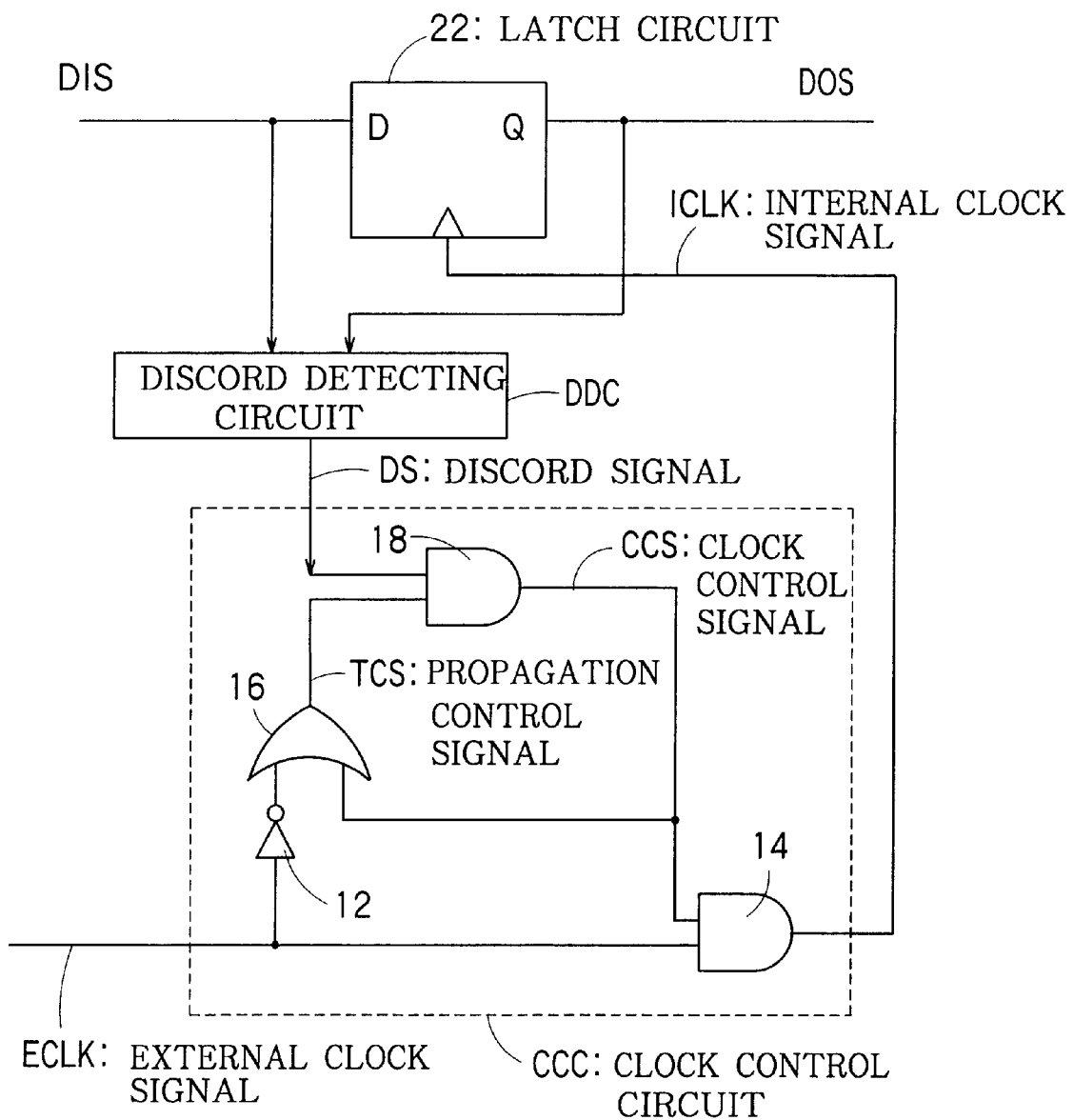
F I G. 6

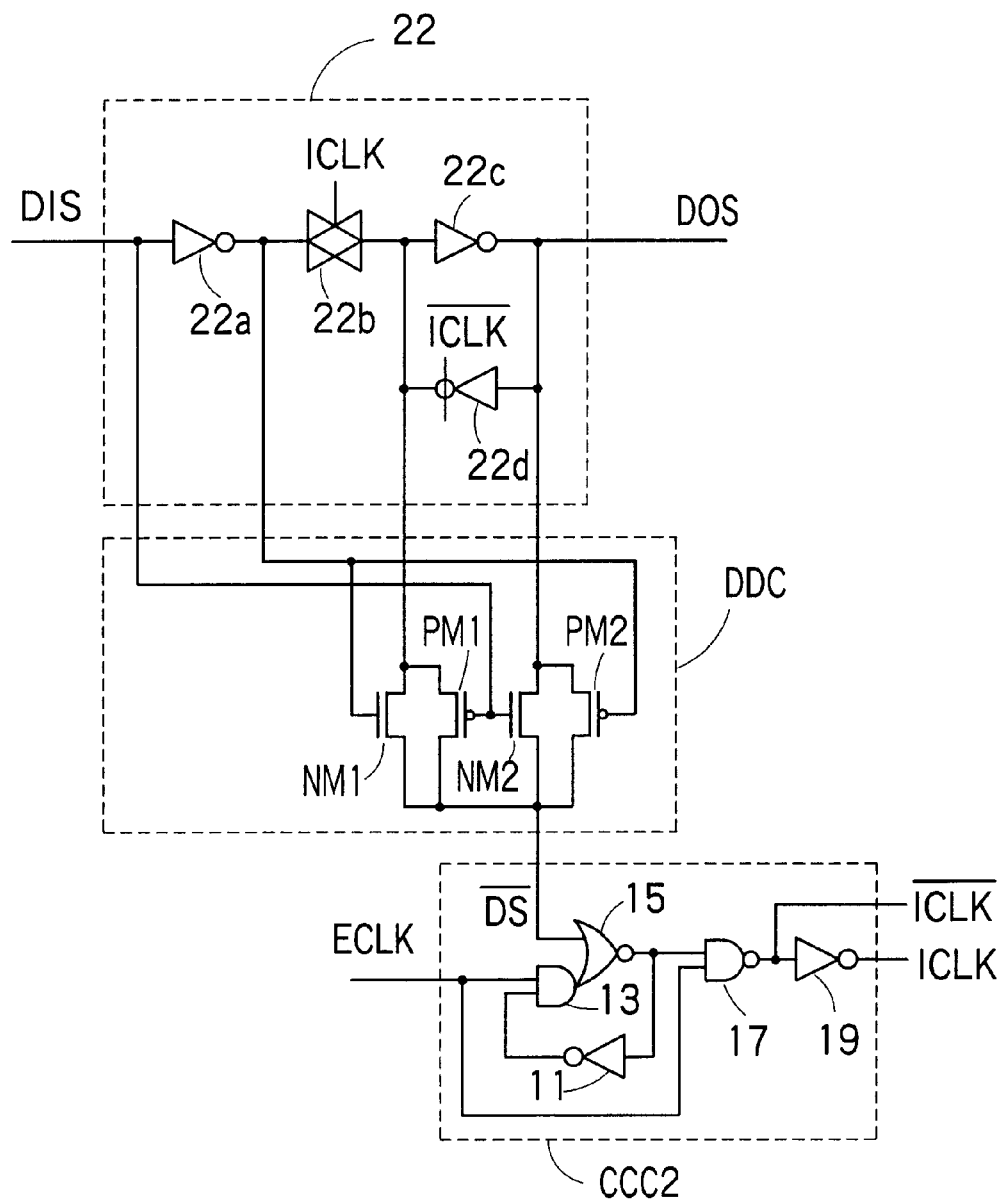
F I G. 7

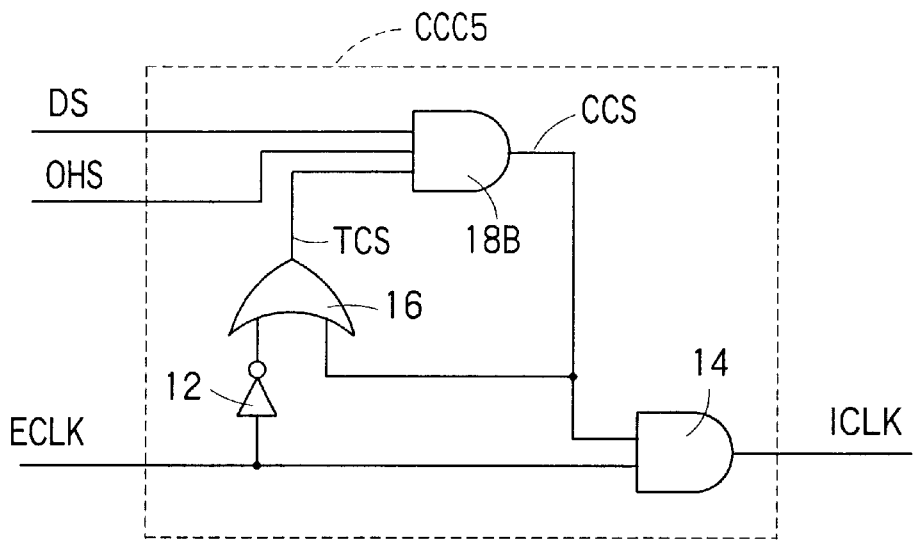
F I G. 10
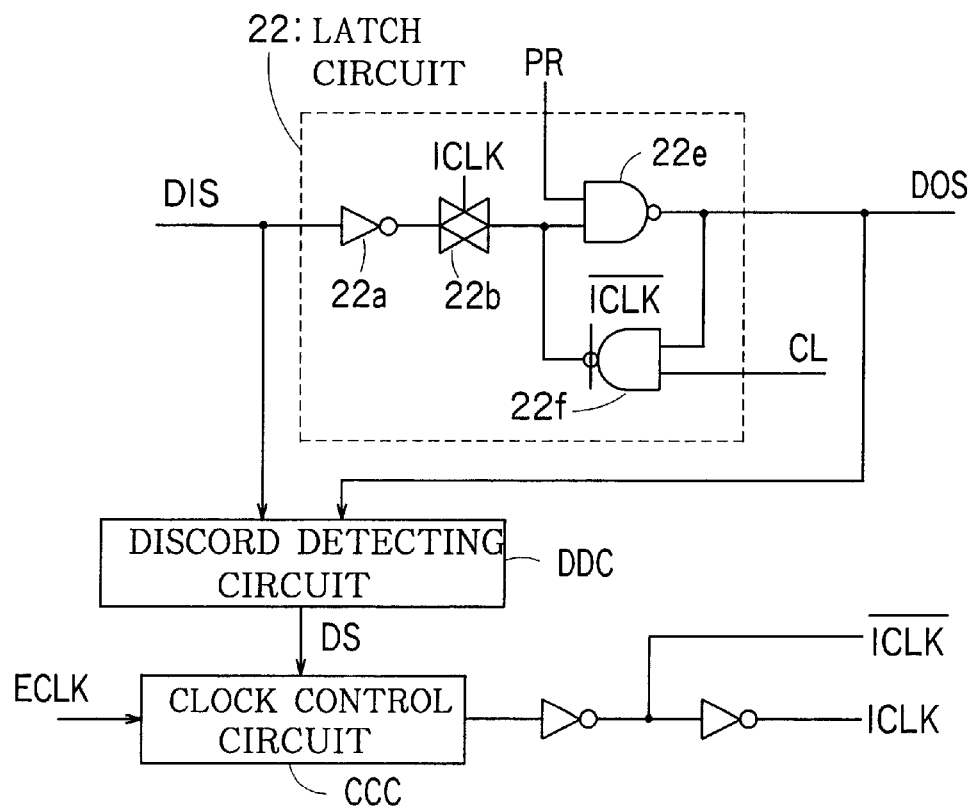
F I G. 11

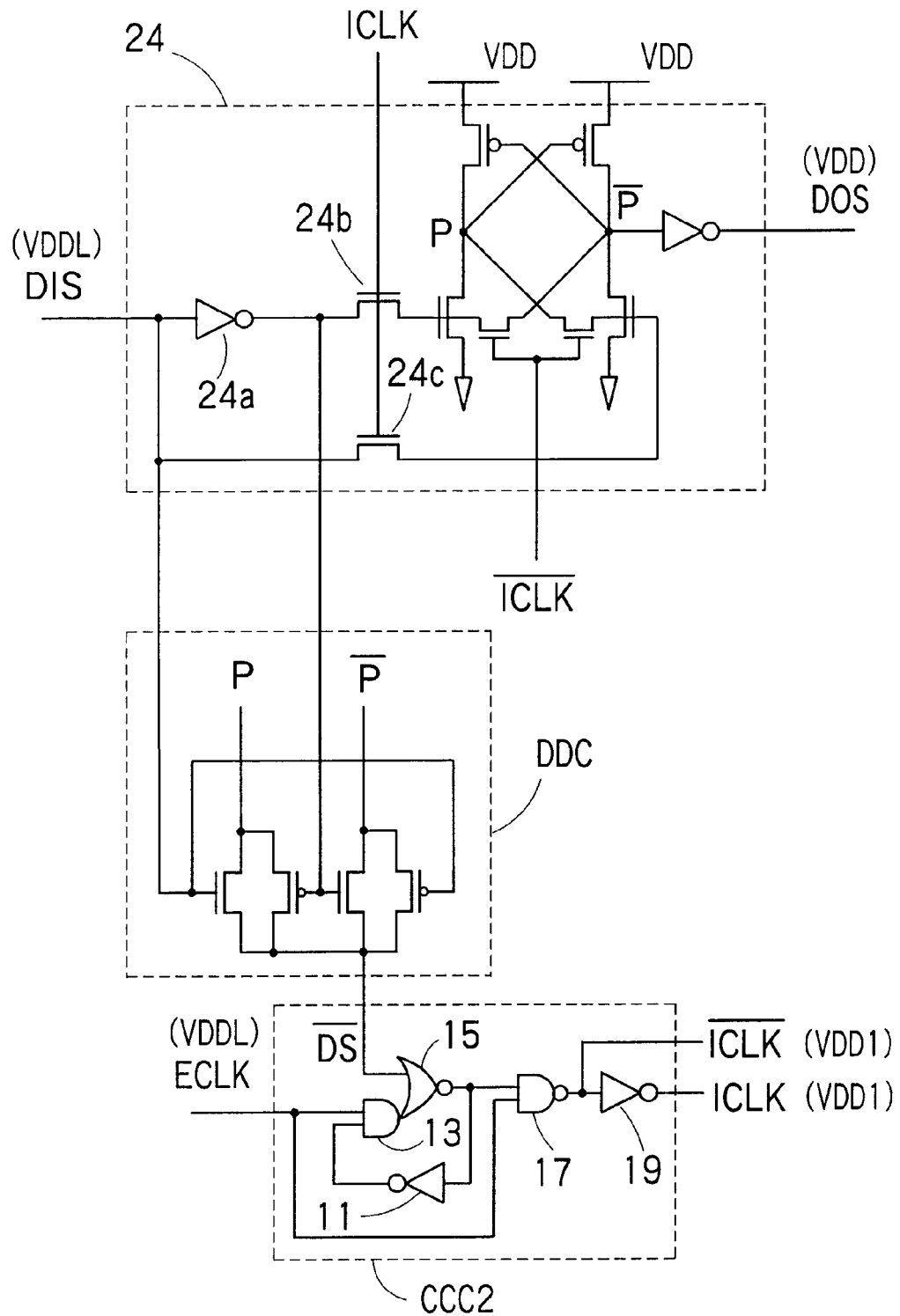
F I G. 12

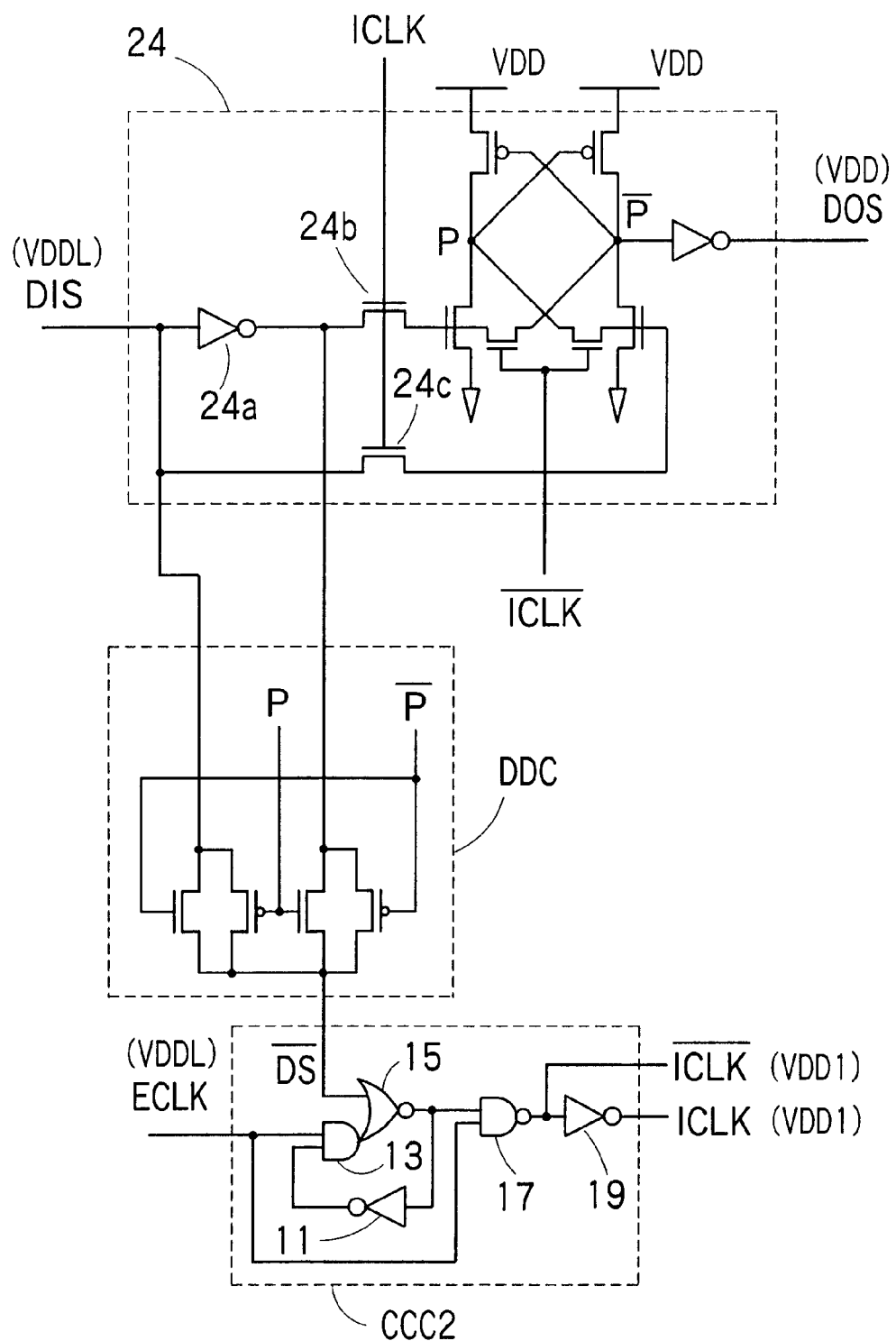
F I G. 12A

FLIP-FLOP CIRCUIT WITH CLOCK SIGNAL CONTROL FUNCTION AND CLOCK CONTROL CIRCUIT

BACKGROUND OF THE INVENTION

1. Field of the Invention

The present invention relates generally to a flip-flop circuit with clock signal control function, and a clock control circuit. More specifically, the invention relates to a flip-flop circuit having suppressed electric power consumption, and a clock control circuit for suppressing electric power consumption.

2. Description of the Prior Art

In order to operate a flip-flop circuit, it is required to input clock signals thereto. On the time average, most of logic circuits in an integrated circuit are not operated to be stopped. However, since clock signals always carry out transition in accordance with the operating frequency thereof, most of electric power consumption of the integrated circuit is occupied by that of the flip-flop circuit and a clock tree. An example of such a typical flip-flop circuit is shown in FIG. 14. As can be seen from FIG. 14, signals of high and low levels are alternately inputted to a CP terminal serving as a clock signal input terminal, and the gate terminals of 12 transistors, which are half of all of 24 transistors constituting a flip-flop circuit 10, are charged and discharged whenever the signals are inputted.

A proposal to reduce electric power consumption of a flip-flop circuit is disclosed in Japanese Patent Laid-Open No. 4-298115. In a circuit disclosed in Japanese Patent Laid-Open No.4-298115, a data input signal of a master slave flip-flop circuit is compared with a data output signal thereof. Only when the data input signal is different from the data output signal, a clock signal is supplied to the flip-flop circuit, and when the data input signal is the same as the data output signal, the level of a clock signal is fixed to be a low level.

However, in the construction disclosed in Japanese Patent Laid-Open No. 4-298115, there is a problem in that malfunction occurs if the input signal of the flip-flop circuit varies while the clock signal remains at a high level. That is, it is assumed that the input signal to the flip-flop circuit varies when the supply of an internal clock signal to the flip-flop circuit is stopped, i.e., while the low level of the internal clock signal is held. In this case, if the level of a clock signal inputted from the outside is the high level, the level of the internal clock signal supplied to the flip-flop circuit varies from the low level to the high level, so that malfunction occurs.

In order to solve such a problem, Nogawa et al. has proposed a method for preventing malfunction by sufficiently shortening the time for a clock signal to remain at a high level (Symposium on VLSI Circuits Digest of Technical Paper, p101–102). If each of flip-flop circuits has a mechanism for generating a short-pule clock signal wherein the time for the clock signal to remain at the high level is sufficiently short, the area of the flip-flop circuit increases, and electric power consumption increases. Therefore, a plurality of flip-flop circuits are grouped, and short-pulse clock signals are collectively supplied to the group of flip-flop circuits. However, since a pulse-like signal has a great tendency to deteriorate when the signal propagates in a wiring, it is required to carefully design the distance between a clock signal generating circuit for generating such a short-pulse clock signal and a flip-flop circuit. It is also required to design the pulse width of the short-pulse clock signal in view of such an influence on distortion.

SUMMARY OF THE INVENTION

It is therefore an object of the present invention to eliminate the aforementioned problems and to prevent malfunction from occurring in a flip-flop circuit even if a data input signal to the flip-flop circuit varies in any timing, while suppressing electric power consumption. It is another object of the present invention to remove the need for adjusting the pulse width of a clock signal and to prevent the problem of distortion due to the propagation of the clock signal.

In order to accomplish the aforementioned and other objects, according to one aspect of the present invention, a flip-flop circuit with clock signal control function comprises: a data holding output circuit for receiving a data input signal and an internal clock signal and for holding a value of the data input signal in synchronism with the internal clock signal to output the value of the data input signal as a data output signal; a discord detecting circuit for receiving the data input signal and data output signal of the data holding output circuit and for detecting the discord of the data input signal with the data output signal to output a discord signal; and a clock control circuit for receiving an external clock signal and the discord signal, and for outputting a shorter pulse than one cycle of the external clock signal as the internal clock signal in synchronism with the rising or falling of the external clock signal when the data input signal discords with the data output signal, and a signal of a first level as the internal clock signal when the data input signal coincides with the data output signal.

According to another aspect of the present invention, there is provided a clock control circuit for receiving an external clock signal and a supply control signal and for outputting an internal clock signal, wherein the internal clock signal is an AND of a clock control signal and the external clock signal, the clock control signal being an AND of the supply control signal and a propagation control signal, and the propagation control signal being an OR of the clock control signal, and a NOT of the external clock signal.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 1 is a diagram of the first preferred embodiment of a flip-flop circuit with clock signal control function according to the present invention;

FIG. 2 is a timing chart for explaining the operation of the first preferred embodiment of a flip-flop circuit with clock signal control function according to the present invention (when a data input signal varies while an external clock signal remains at a low level);

FIG. 3 is a timing chart for explaining the operation of the first preferred embodiment of a flip-flop circuit with clock signal control function according to the present invention (when a data input signal varies while an external clock signal remains at a high level);

FIG. 4 is a diagram of the second preferred embodiment of a flip-flop circuit with clock signal control function according to the present invention;

FIG. 4A is a diagram of a modified example of a discord detecting circuit (second preferred embodiment);

FIG. 5 is a diagram of the third preferred embodiment of a flip-flop circuit with clock signal control function according to the present invention;

FIG. 6 is a diagram of the fourth preferred embodiment of a flip-flop circuit with clock signal control function according to the present invention;

FIG. 7 is a diagram of the fifth preferred embodiment of a flip-flop circuit with clock signal control function according to the present invention;

FIG. 10 is a diagram of a modified example of a clock control circuit (eighth preferred embodiment);

FIG. 11 is a diagram of the ninth preferred embodiment of a flip-flop circuit with clock signal control function according to the present invention;

FIG. 12 is a diagram of the tenth preferred embodiment of a flip-flop circuit with clock signal control function according to the present invention;

FIG. 12A is a diagram of a modified example of a discord detecting circuit (tenth preferred embodiment);

Figure 8:
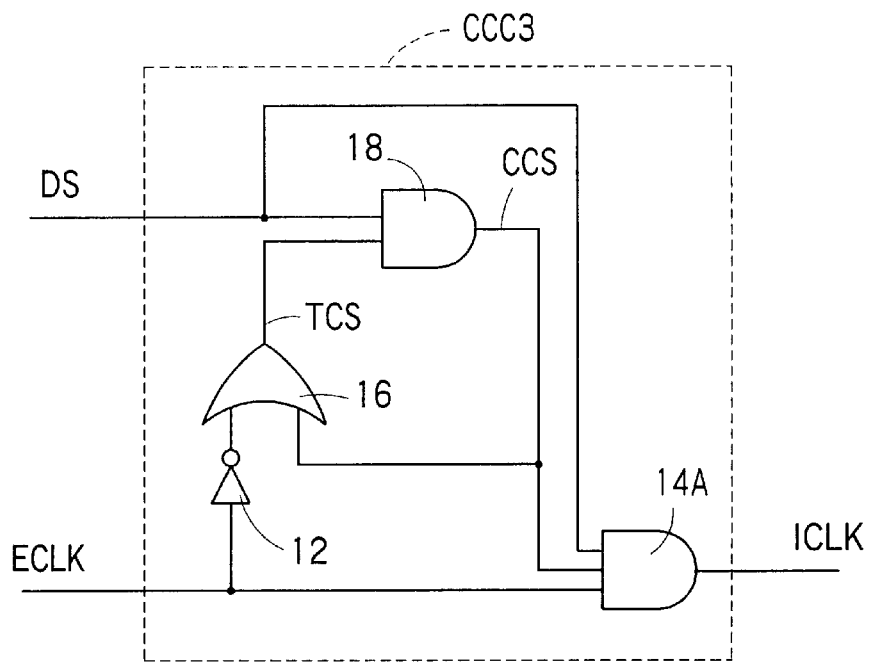
FIG. 8 is a diagram of a modified example of a clock control circuit (sixth preferred embodiment)

DESCRIPTION OF THE PREFERRED EMBODIMENTS (First Preferred Embodiment)

In the first preferred embodiment of the present invention, a flip-flop circuit includes a clock control circuit for supplying an internal clock signal to the flip-flop circuits only when an input signal varies. This clock control circuit is designed to supply an internal clock signal to the flip-flop circuits in synchronism with the rising of an external clock signal, and to stop the supply of the internal clock signal after it is detected that the variation in data output signal has been ascertained. Thus, it is possible to obtain the same effect as the fact that a short-pulse internal clock signal is supplied to the flip-flop circuit. Thus, it is possible to remove the need for adjusting the pulse width of the external clock signal, and it is possible to prevent the problem of distortion due to the propagation of a short-pulse external clock signal. This preferred embodiment will be described in detail below.

FIG. 1 is a circuit diagram of an example of a flip-flop circuit with clock signal control function in this preferred embodiment.

As can be seen from FIG. 1, the flip-flop circuit with clock signal control function comprises a flip-flop circuit 10, a discord detecting circuit DDC, and a clock control circuit CCC.

A data input signal DIS is inputted to an input terminal D of the flip-flop circuit 10, and a data output signal DOS is outputted from an output terminal Q of the flip-flop circuit 10. In addition, an internal clock signal ICLK is inputted to a clock input terminal of the flip-flop circuit 10. The flip-flop circuit 10 is a master slave flip-flop circuit, and has the function of holding the data input signal DIS at the rising of the internal clock signal ICLK until the next rising of the internal clock signal ICLK. The flip-flop circuit 10 constitutes a data holding output circuit in this preferred embodiment.

The discord detecting circuit DDC receives the data input signal DIS and data output signal DOS of the flip-flop circuit 10, and outputs a discord signal DS. The discord detecting circuit DDC is a circuit for detecting whether the data input signal DIS coincides with the data output signal DOS, and outputs the discord signal DS when it is detected that the data input signal DIS discords with the data output signal DOS. The discord signal DS is outputted to the clock control circuit CCC.

While the discord signal DS has been generated on the basis of the data input signal DIS and the data output signal DOS in this preferred embodiment, the discord signal DS may be generated on the basis of a signal equivalent to the data input signal DIS and a signal equivalent to the data output signal DOS in the flip-flop circuit 10. In order to generate the discord signal DS, it is effective to use an exclusive OR (EXOR) circuit.

The clock control circuit CCC receives an external clock signal ECLK in addition to the discord signal DS, and outputs the above described internal clock signal ICLK to the flip-flop circuit 10. The clock control circuit CCC comprises a NOT circuit 12, an AND circuit 14, an OR circuit 16 and an AND circuit 18. The external clock signal ECLK is inputted to the NOT circuit 12 and the AND circuit 14. An output signal of the NOT circuit 12 is inputted to the OR circuit 16. A propagation control signal TCS serving as an output signal of the OR circuit 16 is inputted to the AND circuit 18. The AND circuit 18 also receives the discord signal DS outputted from the discord detecting circuit DDC, and outputs a clock control signal CCS serving as an input signal to the AND circuit 14 and the OR circuit 16. That is, the clock control signal CCS is generated by an AND of the discord signal DS and the propagation control signal TSC. In addition, the propagation control signal TCS is generated by an OR of a NOT of the external clock signal ECLK and the clock control signal CCS. The AND circuit 14 receives the clock control signal CCS and the above described external clock signal ECLK, and outputs an internal clock signal ICLK as an input signal to the flip-flop circuit. That is, the internal clock signal ICLK is generated by an AND of the clock control signal CCS and the external clock signal ECLK.

Referring to FIGS. 2 and 3, the operation of a flip-flop circuit with clock signal control function in this preferred embodiment will be described below. FIG. 2 is a timing chart when the data input signal DIS varies while the external clock signal ECLK remains at a low level, and FIG. 3 is a timing chart when the data input signal DIS varies while the external clock signal remains at a high level.

First, referring to FIG. 2, the operation when the data input signal DIS varies while the external clock signal ECLK remains at a low level will be described below.

As can be seen from FIG. 2, it is assumed that the level of the data input signal DIS varies from a low level to a high level at time t1. Then, the data input signal DIS discords with the data output signal DOS in the flip-flop circuit 10, so that the level of the discord signal DS of the discord detecting circuit DDC varies from a low level to a high level. Since the level of the propagation control signal TCS is also a high level at time t1, the level of the clock control signal CCS also varies from a low level to a high level. However, since the level of the external clock signal ECLK is a low level, the internal clock signal ICLK remains at a low level.

Then, the level of the external clock signal ECLK varies from a low level to a high level at time t2. Then, the level of the internal clock signal ICLK also varies from a low level to a high level since the level of the clock control signal CCS is a high level. The internal clock signal ICLK has inputted to the flip-flop circuit 10. The flip-flop circuit 10 is operated in synchronism with the rising of the internal clock signal ICLK. That is, the flip-flop circuit 10 outputs a value of the data input signal DIS at the rising of the internal clock signal ICLK, as the data output signal DOS. However, at this time, it takes a delay time of ΔT as a delay time for the flip-flop circuit 10 to operate. Therefore, at time t3 after the elapse of ΔT from time t2, the level of the data output signal DOS varies from a low level to a high level.

Since the data output signal DOS coincides with the data input signal DIS at time t3, the level of the discord signal DS varies from the high level to the low level. Therefore, the level of the clock control signal CCS also varies from the high level to the low level, and the level of the internal clock signal ICLK also varies from the high level to the low level.

Referring to FIG. 3, the operation when the data input signal DIS varies while the external clock signal ECLK at a high level will be described below.

As can be seen from FIG. 3, it is assumed that the level of the data input signal DIS varies from a low level to a high level at time t1. Then, the data input signal DIS discords with the data output signal DOS in the flip-flop circuit 10, so that the level of the discord signal DS of the discord detecting circuit DDC varies from a low level to a high level. However, since the level of the propagation control signal TCS is a low level at time t1, therefore clock control signal CCS remains at a low level, the internal clock signal ICLK remains at a low level.

Then, at time t2, the level of the external clock signal ECLK varies from a high level to a low level, and the level of the propagation control signal TCS varies from a low level to a high level. Since both of the propagation control signal TCS and the discord signal DS remain at a high level, the level of the clock control signal CCS also varies from a low level to a high level. However, since the level of the external clock signal ECLK is a low level at time t2, the internal clock signals ICLK remains at a low level.

Then, the level of the external clock signal ECLK varies from a low level to a high level at time t3. Then, the level of the internal clock signal ICLK also varies from the low level to the high level since the level of the clock control signal CCS is a high level. The internal clock signal ICLK is inputted to the flip-flop circuit 10. The flip-flop circuit 10 is operated in synchronism with the rising of the internal clock signal ICLK. That is, the flip-flop circuit 10 outputs a value of the data input signal DIS at the rising of the internal clock signal ICIK, as the data output signal DOS. However, at this time, it takes a delay time of ΔT as a delay time for the flip-flop circuit 10 to operate. Therefore, at time t4 after the elapse of ΔT from time t3, the level of the data output signal DOS varies from a low level to a high level.

Since the data output signal DOS coincides with the data input signal DIS at time t4, the level of the discord signal DS varies from the high level to the low level. Therefore, the level of the clock control signal CCS also varies from the high level to the low level, and the level of the internal clock signal ICLK also varies from the high level to the low level.

As described above, according to the flip-flop circuit with clock signal control function in this preferred embodiment, when the data input signal DIS coincides with the data output signal DOS, the level of the internal clock signal is fixed to be a low level, and only when the data input signal DIS discords with the data output signal DOS, the internal clock signal ICLK is supplied to the flip-flop circuit 10, so that it is possible to suppress electric power consumption. In particular, in the case of a low data transition probability wherein the variation in data input signal is not so great, it is possible to considerably suppress electric power consumption.

In addition, since the clock control circuit CCC is provided for rising the internal clock signal ICLK in synchronism with the rising of the external clock signal ECLK, it is possible to prevent malfunction from occurring in the flip-flop circuit with clock signal control function even if the data input signal DIS varies while the external clock signal ECLK remains at the low level and even if the data input signal DIS varies while the external clock signal ECLK remains at the high level.

In addition, since the internal clock signal ICLK is designed to rise in synchronism with the rising of the external clock signal ECLK and to fall on the basis of the detected variation in data output signal DOS, it is possible to obtain a short-pulse internal clock signal ICLK. Therefore, the pulse width of the internal clock signal ICLK is shorter than that of the external clock signal ECLK.

Moreover, since the termination of the pulse width of the internal clock signal ICLK is defined in synchronism with the coincidence of the data input signal DIS with the data output signal DOS, it is possible to prevent the pulse width from being too short to operate the flip-flop circuit 10. Therefore, in comparison with a conventional case where a pulse-like clock is used as an external clock signal, it is possible to design a flip-flop circuit without being so conscious of deterioration in a propagation process in a wiring.

(Second Preferred Embodiment)

In the second preferred embodiment of the present invention, the detailed constructions of the master slave flip-flop circuit and discord detecting circuit of the first preferred embodiment of a flip-flop circuit with clock signal control function according to the present invention are described at a logic element level.

FIG. 4 is a diagram of the second preferred embodiment of a flip-flop circuit with clock signal control function according to the present invention.

The flip-flop circuit 10 comprises a clocked inverter 10a, a NOT circuit 10b, a transmission gate 10c, a NOT circuit 10d and a NOT circuit 10e, which are connected in series. The flip-flop circuit 10 further comprises a clocked inverter 10f connected to the NOT circuit 10b in parallel, and a clocked inverter 10g connected to the NOT circuit 10d in parallel. Among these elements, the clocked inverter 10f and the transmission gate 10c are in pervious states while the internal clock signal ICLK remains at a high level. In addition, the clocked inverters 10a and 10g are in pervious states while an inverted internal clock signal /ICLK remains at a high level. The data input signal DIS serving as an input of the flip-flop circuit 10 is inputted to the clocked inverter 10a, and the data output signal DOS serving as an output of the flip-flop circuit 10 is outputted from the NOT circuit 10e.

Among these elements, the clocked inverters 10a and 10f and the NOT circuit 10b constitute a master latch circuit ML, and the inverters 10d and 10e and the clocked inverter 10g constitute a slave latch circuit SL.

The discord detecting circuit DDC comprises n-type MOS transistors NM1 and NM2, and p-type MOS transistors PM1 and PM2. The discord detecting circuit DDC is designed to output a low level discord signal /DS when it is detected that the data input signal DIS discords with the data output signal DOS.

The data input signal DIS is inputted to the control terminal of the n-type MOS transistor NM1. The input terminal of the n-type MOS transistor is connected to the input side of the NOT circuit 10d. Therefore, a signal equivalent to the data output signal DOS is inputted to the input terminal of the n-type MOS transistor NM1. The output terminal of the n-type MOS transistor NM1 is connected to a clock control circuit CCC2.

The control terminal of the p-type MOS transistor PM1 is connected to the input side of the NOT circuit 10b.

Therefore, a signal equivalent to the inverted signal of the data input signal DIS is inputted to the control terminal of the p-type MOS transistor PM1. The input terminal of the p-type MOS transistor PM1 is connected to the input side of the NOT circuit 10d. Therefore, a signal equivalent to the data output signal DOS is inputted to the input terminal of the p-type MOS transistor PM1. The output terminal of the p-type MOS transistor PM1 is connected to the clock control circuit CCC2.

The control terminal of the n-type MOS transistor NM2 is connected to the input side of the NOT circuit 10b. Therefore, a signal equivalent to the inverted signal of the data input signal DIS is inputted to the control terminal of the n-type MOS transistor NM2. The input terminal of the n-type MOS transistor NM2 is connected to the input side of the NOT circuit 10e. Therefore, a signal equivalent to the inverted signal of the data output signal DOS is inputted to the input terminal of the n-type MOS transistor NM2. The output terminal of the n-type NOS transistor NM2 is connected to the clock control circuit CCC2.

The data input signal DIS is inputted to the control terminal of the p-type MOS transistor PM2. The input terminal of the p-type MOS transistor PM2 is connected to the input side of the NOT circuit 10e. Therefore, a signal equivalent to the inverted signal of the data output signal DOS is inputted to the input terminal of the p-type NOS transistor PM2. The output terminal of the p-type MOS transistor PM2 is connected to the clock control circuit CCC2.

The clock control circuit CCC2 is converted from the clock control circuit CCC in FIG. 1 so as to provide an efficient circuit construction. However, the clock control circuit CCC2 is logically equivalent to the clock control circuit CCC shown in FIG. 1. In addition, a NOT circuit for generating the inverted internal clock signal /ICLK is combined with a two-input AND circuit 14 of the clock control circuit CCC to form a two-input NAND circuit to reduce the number of transistors. Therefore, the clock control circuit CCC2 comprises a NOT circuit 11, an AND circuit 13, a NOR circuit 15 and a NAND circuit 17.

The AND circuit 13 receives the output clock signal ECLK and the inverted signals of clock control signal CCS, and outputs a propagation control signal /TCS. The NOR circuit 15 receives the discord signal /DS and the propagation control signal /TCS, and outputs the clock control signal CCS. The NAND circuit 17 receives the clock control signal CCS and the external clock signal ECLK, and outputs the inverted internal clock signal /ICLK. The NOT circuit 19 receives the inverted internal clock signal /ICLK, and outputs the internal clock signal ICLK.

Since the operation of the second preferred embodiment of a flip-flop circuit with clock signal control function is the same as that in the first preferred embodiment, the description thereof is omitted.

Furthermore, the discord detecting circuit DDC may be modified as shown in FIG. 4A.

(Third Preferred Embodiment)

In the third preferred embodiment of the present invention, the master latch circuit part of a flip-flop circuit is formed by a dynamic circuit to reduce the number of transistors.

FIG. 5 is a circuit diagram showing an example of a flip-flop circuit with clock signal control function in this preferred embodiment.

In the above described second preferred embodiment, the master slave flip-flop circuit 10 has comprised a static circuit as can be seen from FIG. 4. On the other hand, in the third preferred embodiment, as can be seen from FIG. 5, a master latch circuit ML2 of a flip-flop circuit 20 comprises a dynamic circuit since the time for the internal clock signal ICLK to remain at a high level is very short in the clock control circuits CCC and CCC2 according to the present invention. That is, the master latch circuit comprises a NOT circuit 10h, a transmission gate 10i and a NOT circuit 10j, which are connected in series.

That is, the NOT circuits 10h and 10j and the transmission gate 10i constitute the master latch circuit ML2, and the inverters 10d and 10e and the clocked inverter 10g constitute the slave latch circuit SL.

Thus, the master latch circuit ML2 of the flip-flop circuit 20 is formed by a dynamic circuit, so that it is possible to reduce the number of transistors.

(Fourth Preferred Embodiment)

In the fourth preferred embodiment of the present invention, taking notice of the fact that the time for the internal clock signal ICLK to remain at a high level is very short, the flip-flop circuit in the first preferred embodiment is replaced with a latch circuit to reduce the number of transistors.

FIG. 6 is a circuit diagram of the fourth preferred embodiment of a flip-flop circuit with clock signal control function according to the present invention.

As can be seen from FIG. 6, the flip-flop circuit with clock signal control function has a latch circuit 22. That is, in place of the flip-flop circuit 10 of the first preferred embodiment of a flip-flop circuit with clock signal control function according to the present invention which is shown in FIG. 1, a latch circuit 22 is provided as shown in FIG. 6. Because it is possible to obtain an edge trigger type flip-flop operation even if the flip-flop circuit 10 is replaced with the latch circuit 22, since the time for the internal clock signal ICLK to remain at a high level is very short.

While the internal clock signal ICLK remains at a high level, the latch circuit 22 shown in FIG. 6 transmits the value of the data input signal DIS of the input terminal D to the output of the output terminal Q, and outputs as the data output signal DOS. On the other hand, while the internal clock signal ICLK remains at a low level, the latch circuit 22 holds the value of the output terminal Q at the falling of the internal clock signal ICLK, and outputs as the data output signal DOS. In this preferred embodiment, the latch circuit 22 constitutes a data holding output circuit.

If the flip-flop circuit with clock signal control function is thus formed, it is possible to reduce the number of transistors. That is, in this preferred embodiment, although the hold time characteristic serving as one of the characteristics of a flip-flop circuit deteriorates in comparison with that in the above described third preferred embodiment, it is possible to reduce a larger number of transistors than that in the third preferred embodiment.

(Fifth Preferred Embodiment)

In the fifth preferred embodiment of the present invention, the detailed constructions of the latch circuit and discord detecting circuit of the fourth preferred embodiment of a flip-flop circuit with clock signal control function according to the present invention are described at a logic element level.

FIG. 7 is a diagram of the fifth preferred embodiment of a flip-flop circuit with clock signal control function according to the present invention. The latch circuit 22 comprises a NOT circuit 22a, a transmission gate 22b and a NOT circuit 22c, which are connected in series. The latch circuit 22 further comprises a clocked inverter 22d connected to the NOT circuit 22a in parallel.

In FIG. 7, the clock control circuit CCC2 is logically equivalent to the clock control circuit CCC shown in FIG. 6 although the clock control circuit CCC2 is converted logically from clock control circuit CCC in FIG. 6 so as to provide an efficient circuit construction. In addition, a NOT circuit for generating the inverted internal clock signal /ICLK is combined with a two-input AND circuit 14 of the clock control circuit CCC to form a two-input NAND circuit to reduce the number of transistors.

(Sixth Preferred Embodiment)

In the sixth preferred embodiment of the present invention, a modified example of a clock control circuit is provided. FIG. 8 is a circuit diagram of the sixth preferred embodiment of a clock control circuit according to the present invention. As can be seen from FIG. 8, a clock control circuit CCC3 in the sixth preferred embodiment is provided with a three-input AND circuit 14A in place of the two-input AND circuit of any one of the clock control circuit CCC in the above described first preferred embodiment (see FIG. 1) and the clock control circuit CCC in the above described fourth preferred embodiment (see FIG. 6). The AND circuit 14A receives a discord signal DS outputted from a discord detecting circuit DDS, in addition to a clock control signal CCS outputted from an AND circuit 18 and an external clock signal ECLK.

If the clock control circuit CCC 3 is thus formed, it is possible to quickly change the level of the internal clock signal ICLK from a high level to a low level when the level of the discord signal DS varies from a high level to a low level. That is, since there is provided a path for directly inputting the discord signal DS to the AND circuit 14A for generating the internal clock signal ICLK, it is possible to by-pass the delay caused in the AND circuit 18 to directly change the internal clock signal ICLK from the high level to the low level.

In particular, while the hold time characteristic has deteriorated by combining the clock control circuit CCC with the latch circuit 22 to carry out the flip-flop operation in the above described fourth preferred embodiment, it is possible to improve the hold time characteristic by using the clock control circuit CCC3 in this preferred embodiment. That is, in the case of the above described fourth preferred embodiment, the time for the internal clock signal ICLK to remain at the high level tends to be long to deteriorate the hold time characteristic, whereas in a case where the clock control circuit CCC3 in this preferred embodiment is used, it is possible to reduce the time for the internal clock signal ICLK to remain at the high level. That is, it is possible to narrow the pulse width of the internal clock signal ICLK, and it is possible to improve the hold time characteristic.

(Seventh Preferred Embodiment)

Figure 9:
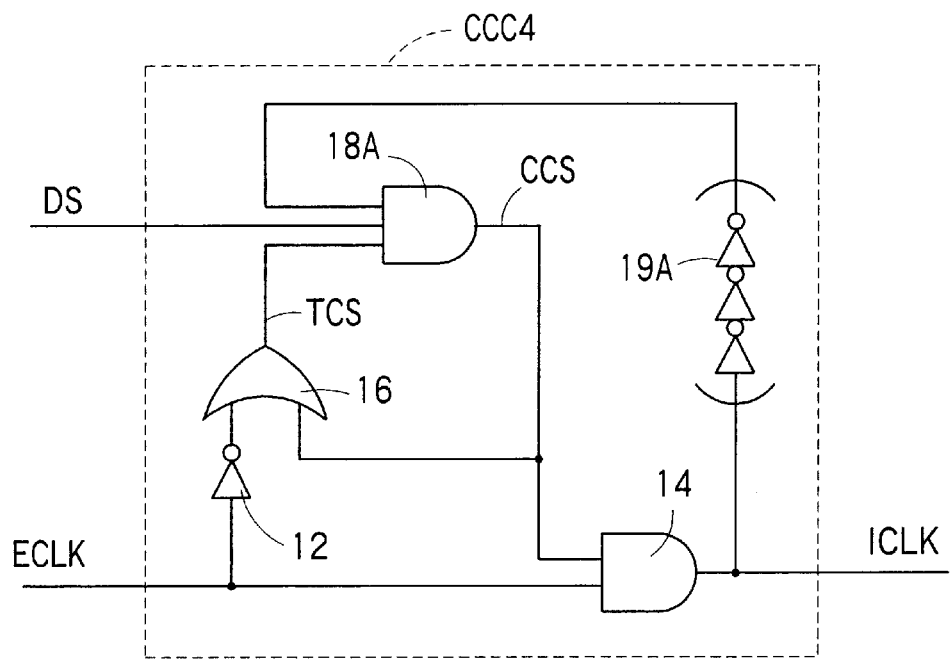
FIG. 9 is a diagram of a modified example of a clock control circuit (seventh preferred embodiment)

In the seventh preferred embodiment of the present invention, another modified example of a clock control circuit is provided. FIG. 9 is a circuit diagram of the seventh preferred embodiment of a clock control circuit according to the present invention. As can be seen from FIG. 9, a clock control circuit CCC4 in the seventh preferred embodiment is provided with a three-input AND circuit 18A in place of the two-input AND circuit 18 of any one of the clock control circuit CCC in the first preferred embodiment (see FIG. 1) and the clock control circuit CCC in the fourth preferred embodiment (see FIG. 6). In addition, the internal clock signal ICLK outputted from the AND circuit 14 is fed back to the AND circuit 18 via one or more NOT circuits (inverters) 19A. In this preferred embodiment, it is possible to provide an odd number of NOT circuits 19.

If the clock control circuit CCC4 is thus formed, it is possible to adjust the pulse width of the internal clock signal ICLK. That is, since the transition of the internal clock signal ICLK is fed back to the AND circuit 18A, it is possible to easily control the pulse width of the internal clock signal ICLK. In addition, this pulse width can be adjusted by changing the number of stages of the NOT circuits 19A.

In addition, similar to the clock control circuit CCC3 in the above described sixth preferred embodiment, the use of the clock control circuit CCC4 in this preferred embodiment is effective in improvement of the hold time characteristic in the fourth preferred embodiment.

(Eighth Preferred Embodiment)

In the eighth preferred embodiment, the above described clock control circuit is modified so as to be able to input other control signals in place of or in addition to a discord signal. Specifically, a flip-flop circuit is designed to have a data holding function by inputting an output holding signal to a clock control circuit. FIG. 10 is a circuit diagram of the eighth preferred embodiment of a clock control circuit according to the present invention.

As can be seen from FIG. 10, a clock control circuit CCC5 in the eighth preferred embodiment is provided with a three-input AND circuit 18B in place of the two-input AND circuit 18 of any one of the clock control circuit CCC in the first preferred embodiment (see FIG. 1) and the clock control circuit CCC in the fourth preferred embodiment (see FIG. 6). The AND circuit 18B receives an output holding signal OHS. The output holding signal OHS remains at a low level when it is intended to hold the data output signal DOS of the flip-flop circuit with clock signal control function, and at a high level when it is not required to hold the data output signal DOS.

If the clock control circuit CCC in any one of the first and fourth preferred embodiment is replaced with the above described clock control circuit CCC5, it is possible to provide a flip-flop circuit with clock signal control function having a data holding function. That is, while the output holding signal OHS remains at a low level, the value of the data output signal DOS of the flip-flop circuit 10 or latch circuit 22 is held regardless of the value of the discord signal DS. On the other hand, while the output holding signal OHS remains at a high level, only when the level of the discord signal DS is a high level, i.e., only when the data input signal DIS discord with the data output signal DOS, the flip-flop circuit or the latch circuit 22 reads the value of the data input signal DIS.

In addition, the function equivalent to a flip-flop circuit with clock signal control function having a so-called data holding function can be realized by only adding two transistors to the clock control circuit CCC in any one of the first and fourth preferred embodiment.

(Ninth Preferred Embodiment)

In the ninth preferred embodiment of the present invention, the function of fixing the level of a data output signal to a high or low level is added to the above described fourth preferred embodiment.

FIG. 11 is a circuit diagram of an example of a flip-flop circuit with clock signal control function in this preferred embodiment. As can be seen from FIG. 11, a flip-flop circuit with clock signal control function in this preferred embodiment has the function of fixing the level of a data output signal DOS to a high or low level without the need of the data input signal DIS. In order to realize this function, a flip-flop circuit with clock signal control function in this preferred embodiment has a mechanism for inputting a preset signal PR and a clear signal CL in addition to the construction of the latch circuit 22 in any one of the above described fourth and fifth preferred embodiments.

The preset signal PR is added to any one of the inputs of a NAND circuit 22e. The NAND circuit 22e is provided in place of the NOT circuit 22c in the fifth preferred embodiment shown in FIG. 7. The clear signal CL is added to any one of the inputs of a clocked NAND circuit 22f. The clocked NAND circuit 22f is provided in place of the clocked inverter 22d in the fifth preferred embodiment shown in FIG. 7.

In this preferred embodiment, both of preset signal PR and the clear signal CL are set to be high during the usual operation of the flip-flop. Then, the latch circuit 22 carries out a flip-flop operation in synchronism with an internal clock signal ICLK and an inverted internal clock signal /ICLK. On the other hand, when a data output signal DOS is fixed to be high, the preset signal PR is set to be low. Then, the data output signal DOS of the latch circuit 22 is fixed to be high. In addition, when the data output signal DOS is fixed to be low, the clear signal CL is set to be low. Then, the data signal DOS of the latch circuit 22 is fixed to be low.

According to the flip-flop circuit with clock signal control function having a data holding function with the above described construction, it is possible to add the function of fixing the level of the data output signal DOS to be high or low by adding four transistors. That is, it is required to add eight transistors in order to add this function to a typical master slave flip-flop circuit, whereas it is possible to add this function by adding only four transistors in this preferred embodiment.

(Tenth Preferred Embodiment)

In the tenth preferred embodiment of the present invention, even if a low voltage VDDL having a low voltage amplitude is used for a data input signal and external clock signal of a flip-flop circuit with clock signal control function, it is possible to output a data output signal of a higher voltage VDD than the voltage VDDL.

FIG. 12 is a circuit diagram of an example of a flip-flop circuit with clock signal control function in this preferred embodiment. As can be seen from FIG. 12, an external clock signal ECLK is inputted to a clock control circuit. The external clock signal ECLK fluctuates between the ground and the voltage VDDL. The clock control circuit CCC2 outputs an internal clock signal ICLK and an inverted internal clock signal /ICLK. The internal clock signal ICLK and the inverted internal clock signal /ICLK fluctuate between the ground and a voltage VDD1. The voltage VDD1 may be equal to or lower than the voltage VDDL.

The flip-flop circuit 24 receives a data input signal DIS in addition to the internal clock signal ICLK and the inverted internal clock signal /ICLK. The data input signal fluctuates between the ground and the voltage VDDL. In addition, the voltage VDD1 is applied to a NOT circuit 24a of the flip-flop circuit 25 although it can not be seen clearly from the figure. A power supply voltage of the voltage VDD is applied to the flip-flop circuit 24 other than the NOT circuit 24a. Then, the flip-flop circuit 24 outputs a data output signal DOS fluctuating between the ground and the voltage VDD. The voltage VDD is a usual voltage which is higher than the voltage VDDL. The relationship between the above described voltages can be expressed by the follow formula.

$$VDD > VDDL \geq VDD1$$

With the above described construction, it is possible to output the data output signal LOS of the higher voltage VDD than the voltage VDDL even if the voltage VDD having a low amplitude is used for the data input signal DIS and external clock signal ECLK of the flip-flop circuit with clock signal control function.

While a transfer gate comprises n-type MOS transistors 24b and 24c in this preferred embodiment, this part may be formed by a transfer gate comprising a pair of n-type MOS transistor and p-type MOS transistor.

Furthermore, the discord detecting circuit DDC may be modified as shown in FIG. 12A. With the construction as shown in FIG. 12, it is possible to reduce the leak current in the discord detecting circuit DDC.

(Eleventh Preferred Embodiment)

In the eleventh preferred embodiment of the present invention, the above described clock control circuit is used for controlling a clock tree.

Figure 13:
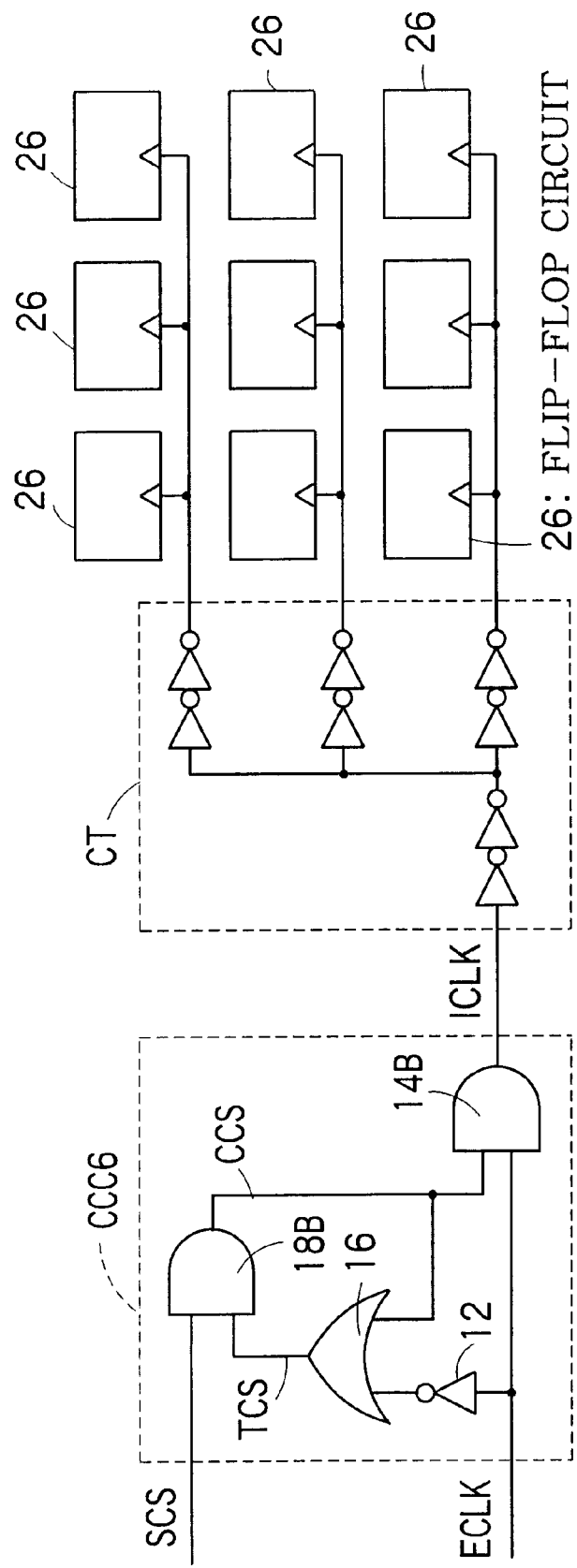
FIG. 13 is a diagram showing an example of the first preferred embodiment of a clock control circuit according to the present invention, which is used for controlling a clock tree (eleventh preferred embodiment)
Figure 14:
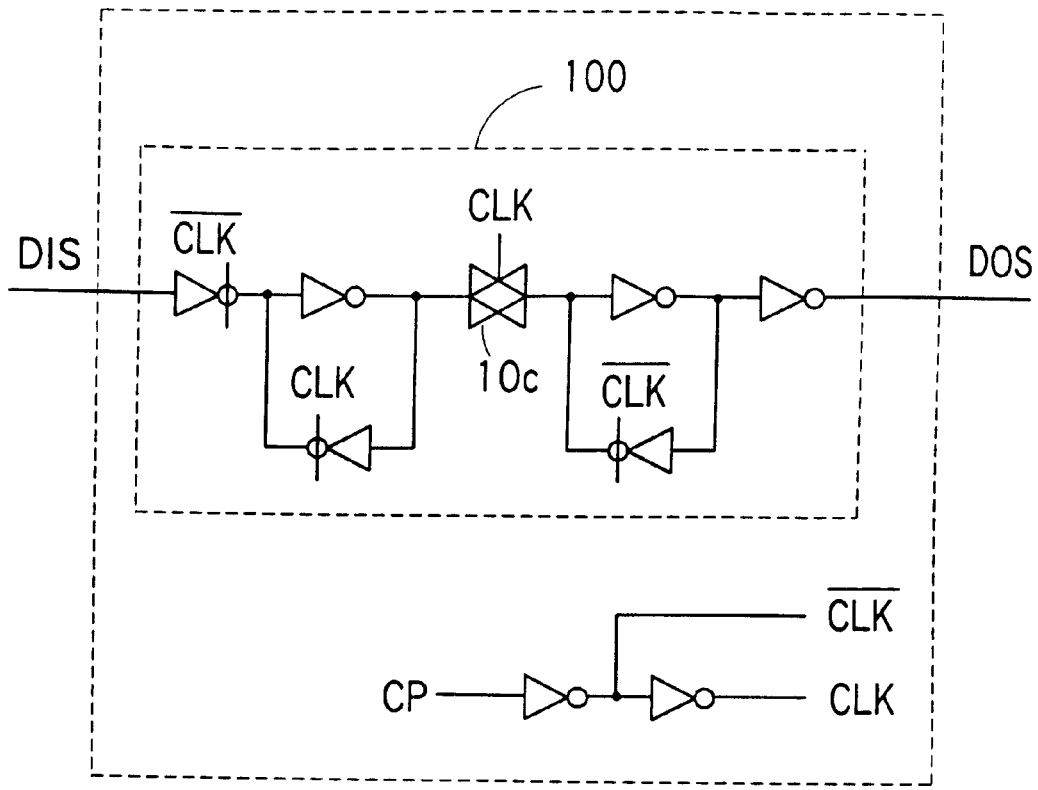
FIG. 14 is a conventional flip-flop circuit.

FIG. 13 is a diagram showing a clock signal wiring including a clock control circuit in this preferred embodiment. As can be seen from FIG. 13, a clock control circuit CCC6 receives an external clock signal ECLK and a supply control signal SCS. Then, an internal clock signal ICLK is outputted from the clock control circuit CCC6. The clock control circuit CCC6 in this preferred embodiment has the same construction as that of the clock control circuit CCC in the above described first preferred embodiment (see FIG. 1). However, the supply control signal is inputted in place of the discord signal DS. The internal clock signal ICLK is supplied to a clock tree CT. From the clock tree CT, a final supply clock signal is outputted. This final supply clock signal is supplied to a plurality of flip-flop circuits 26.

The supply control signal SCS controls the supply of the internal clock signal ICLK from the clock control circuit CCC6. When the level of the supply control signal SCS is high, the internal clock signal ICLK rises in synchronism with the rising of the next external clock signal ECLK to operate the clock tree CT. Immediately after the level of the supply control signal SCS is changed to be low, the level of the internal clock signal ICLK and the level of the output of the clock tree CT are also changed to be low. However, in a logic circuit, such as a flip-flop circuit 26 operating in synchronism with the rising edge of a clock signal, the synchronism with the rising edge of the output of the crock tree CT is important, and it does not much matter that the falling edge is asynchronous.

As described above, if the clock control circuit CCC6 in this preferred embodiment is used, it is possible to suppress electric power consumption in the clock tree CT. That is, it is possible to control whether the clock tree CT is caused to output the final supply clock signal. In addition, according to this preferred embodiment, it is possible to realize the clock control circuit CCC6 by a smaller number of transistors than conventional circuits.

Furthermore, the present invention should not be limited to the above described preferred embodiments, but the invention can be modified in various ways. For example, the present invention can not only be applied to flip-flop circuits or latch circuits, but the invention can also be applied to various data holding output circuits for holding a data input signal and outputting the data input signal as a data output signal in synchronism with a clock signal.

Moreover, the high and low levels in the above described preferred embodiment may be replaced with each other. That is, the above described flip-flop circuit 10 may be replaced with a flip-flop circuit which operates in synchronism with the falling edge of an internal clock signal ICLK. Alternatively, the above described latch circuit 22 may be replaced with a latch circuit for outputting the value of a data input signal DIS as a data output signal DOS while an internal clock signal ICLK rein s at a low level. Even if the high and low levels of the above described signals are replaced with each other, it is possible to obtain the same advantages as those in the above described preferred embodiments.

As described above, according to the present invention, when the data input signal of a data holding output circuit discords with the data output signal thereof, a short pulse is supplied to the data holding output circuit as an internal clock signal in synchronism with the rising of an external clock signal, and when the data input signal coincides with the data output signal, a first level signal is supplied to the data holding output circuit as an internal clock signal, so that it is possible to prevent malfunction from occurring in a flip-flop operation while suppressing electrical power consumption required to supply a clock signal.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A flip-flop circuit with clock signal control function comprises:
    a data holding output circuit for receiving a data input signal and an internal clock signal and for holding a value of said data input signal in synchronism with said internal clock signal to output said value of said data input signal as a data output signal;
    a discord detecting circuit for receiving said data input signal and data output signal of said data holding output circuit and for detecting the discord of said data input signal with said data output signal to output a discord signal; and
    a clock control circuit for receiving an external clock signal and said discord signal, and for outputting a shorter pulse than one cycle of said external clock signal as said internal clock signal in synchronism with the rising or falling of said external clock signal when said data input signal discords with said data output signal, and a signal of a first level as said internal clock signal when said data input signal coincides with said data output signal.

2. A flip-flop circuit with clock signal control function as set forth in claim 1, wherein the pulse width termination of said pulse of said internal clock signal outputted from said clock control circuit is determined in synchronism with the coincidence of said data input signal with said data output signal.

3. A flip-flop circuit with clock signal control function as set forth in claim 1, wherein said discord signal is a signal of a second level when said data input signal discords with said data output signal.

4. A flip-flop circuit with clock signal control function as set forth in claim 3, wherein said first level is a low level, and said second level is a high level.

5. A flip-flop circuit with clock signal control function as set forth in claim 4, wherein said internal clock signal serving as an output of said clock control circuit is an AND of a clock control signal and said external clock signal,
    said clock control signal being an AND of said discord signal and a propagation control signal, and
    said propagation control signal being an OR of said clock control signal and a NOT of said external clock signal.

6. A flip-flop circuit with clock signal control function as set forth in claim 4, wherein said internal clock signal serving as an output of said clock control circuit is an NOT of an NAND of a clock control signal and said external clock signal,
    said clock control signal being a NOR of said discord signal and a propagation control signal, and
    said propagation control signal being an AND of an NOT of said clock control signal and said external clock signal.

7. A flip-flop circuit with clock signal control function as set forth in claim 4, wherein said internal clock signal serving as an output of said clock control circuit is an AND of a clock control signal, said external clock signal and said discord signal,
    said clock control signal being an AND of said discord signal and a propagation control signal, and
    said propagation control signal being an OR of said clock control signal and a NOT of said external clock signal.

8. A flip-flop circuit with clock signal control function as set forth in claim 4, wherein said internal clock signal serving as an output of said clock control circuit is an AND of a clock control signal and said external block signal,
    said clock control signal being an AND of said discord signal, a propagation control signal and a signal delayed from said internal clock signal by a predetermined delay time, and
    said propagation control signal being an OR of said clock control signal and a NOT of said external clock signal.

9. A flip-flop circuit with clock signal control function as set forth in claim 4, wherein said internal clock signal serving as an output of said clock control circuit is an AND of a clock control signal said external clock signal,
    said clock control signal being an AND of said discord signal, a propagation control signal, and an output holding signal, the level of which is low when said data output signal being held and high when it is not required to hold said data output signal, and
    said propagation control signal being an OR of said clock control signal, and a NOT of said external clock signal.

10. A flip-flop circuit with clock signal control function as set forth in claim 4, wherein said discord detecting circuit comprises:
    a first n-type MOS transistor having a control terminal for receiving said data input signal, an input terminal for receiving said data output signal, and an output terminal connected to said clock control circuit;
    a first p-type MOS transistor having a control terminal for receiving an inverted signal of said data input signal, an input terminal for receiving said data output signal, and an output terminal connected to said clock control circuit;
    a second n-type MOS transistor having a control terminal for receiving an inverted signal of said data input signal, an input terminal for receiving an inverted signal of said data output signal, and an output terminal connected to said clock control circuit; and
    a second p-type MOS transistor having a control terminal for receiving said data input terminal, an input terminal for receiving an inverted signal of said data output signal, and an output terminal connected to said clock control circuit.

11. A flip-flop circuit with clock signal control function as set forth in claim 4, wherein said discord detecting circuit comprises:
    a first n-type MOS transistor having a control terminal for receiving said data output signal, an input terminal for receiving said data input signal, and an output terminal connected to said clock control circuit;
    a first p-type MOS transistor having a control terminal for receiving an inverted signal of said data output signal, an input terminal for receiving said data input signal, and an output terminal connected to said clock control circuit;

a second n-type MOS transistor having a control terminal for receiving an inverted signal of said data output signal, an input terminal for receiving an inverted signal of said data input signal, and an output terminal connected to said clock control circuit; and a second p-type MOS transistor having a control terminal for receiving said data output signal, an input terminal for receiving said an inverted signal of data input signal, and an output terminal connected to said clock control circuit.

12. A flip-flop circuit with clock signal control function as set forth in claim 1, wherein said data holding output circuit comprises a flip-flop circuit for acquiring and said data input signal at the rising or falling of said internal clock signal and holding it, and for outputting said data input signal as said data output signal.

13. A flip-flop circuit with clock signal control function as set forth in claim 12, wherein said flip-flop circuit comprises a master latch circuit and a slave latch circuit.

14. A flip-flop circuit with clock signal control function as set forth in claim 13, wherein said master latch circuit comprises a dynamic circuit.

15. A flip-flop circuit with clock signal control function as set forth in claim 1, wherein said data holding output circuit comprises a latch circuit for acquiring said data input signal to output said data input signal as said data output signal while said internal clock signal remains at a second level, and for holding said data input signal, which has been acquired while said internal clock signal remains at said second level, to output said data input signal as said data output signal while said internal clock signal remains at said first level.

16. A flip-flop circuit with clock signal control function as set forth in claim 15, wherein said latch circuit comprises a clear input for receiving a clear signal for fixing said data output signal to be said first level, and a preset input for receiving a preset signal for fixing said data output signal to be said second level.

17. A flip-flop circuit with clock signal control function as set forth in claim 1, wherein said data holding output circuit is designed to output said data output signal of a higher voltage than that of said data input signal.

18. A clock control circuit for receiving an external clock signal and a supply control signal and for outputting an internal clock signal, wherein said internal clock signal is an AND of a clock control signal and said external clock signal, said clock control signal being an AND of said supply control signal and a propagation control signal, and said propagation control signal being an OR of said clock control signal, and a NOT of said external clock signal.

19. A clock control circuit as set forth in claim 18, wherein said internal clock signal is outputted to a clock tree constituting a clock signal wiring.

* * * * *